United States Patent [19]
Maldonado

[11] Patent Number: 5,967,797
[45] Date of Patent: *Oct. 19, 1999

[54] HIGH DENSITY MULTI-PIN CONNECTOR WITH SOLDER POINTS

[75] Inventor: Ralph Maldonado, Temecula, Calif.

[73] Assignee: Teledyne Industries, Inc., Los Angeles, Calif.

[ * ] Notice: This patent is subject to a terminal disclaimer.

[21] Appl. No.: 08/977,414

[22] Filed: Nov. 24, 1997

Related U.S. Application Data

[63] Continuation-in-part of application No. 08/937,101, Sep. 24, 1997.

[51] Int. Cl.$^6$ .................................................... H01R 9/09
[52] U.S. Cl. .............................................. 439/66; 439/83
[58] Field of Search ..................... 439/66, 83, 71, 439/876

[56] References Cited

U.S. PATENT DOCUMENTS

| | | | |
|---|---|---|---|
| 4,021,091 | 5/1977 | Anhalt et al. | 439/260 |
| 4,159,154 | 6/1979 | Arnold | 439/267 |
| 4,538,864 | 9/1985 | Ichimura | 439/69 |
| 4,867,689 | 9/1989 | Redmond et al. | 439/71 |
| 4,936,784 | 6/1990 | Saito | 439/71 |
| 4,976,629 | 12/1990 | Werner | 439/71 |
| 5,139,427 | 8/1992 | Boyd et al. | 439/66 |
| 5,147,207 | 9/1992 | Mowry | 439/66 |
| 5,161,982 | 11/1992 | Mowry | 439/68 |
| 5,226,826 | 7/1993 | Nillson et al. | 439/73 |
| 5,380,210 | 1/1995 | Grabbe et al. | 439/66 |
| 5,395,252 | 3/1995 | White | 439/66 |
| 5,462,440 | 10/1995 | Rothenberger | 439/66 |

*Primary Examiner*—Neil Abrams
*Assistant Examiner*—T C Patel
*Attorney, Agent, or Firm*—Nydegger & Associates

[57] ABSTRACT

A land grid array (LGA) includes a base having a first surface and a second surface which is substantially parallel thereto. The base is formed with a plurality of apertures which open through the base, and a plurality of electrical connectors are mounted on the base. Specifically, the connectors are formed with a central portion, and each connector has one deflectable finger and one extension which project in opposite directions from this central portion. The central portion of the connector is embedded into the base to cantilever the finger and the extension into respective juxtaposed apertures. When not deflected, the finger of the connector projects outwardly from its aperture and beyond the first surface of the base, while the extension is formed with a solder point surface which is generally coplanar with the second surface of the base. In a plurality of apertures, one finger projects one way and another finger projects the other way. With this combination, the electrical contact tips of the fingers are arranged as two matrices, one over the first surface of the base and the other over the second surface. Thus, a plurality of circuits are established between the first surface of the array and the second surface.

19 Claims, 2 Drawing Sheets

ND DENSITY MULTI-PIN CONNECTOR
WITH SOLDER POINTS

HIGH DENSITY MULTI-PIN CONNECTOR WITH SOLDER POINTS

This application is a continuation-in-part of application Ser. No. 08/937,101, filed Sep. 24, 1997, which is currently pending. The contents of application Ser. No. 08/937,101 are incorporated herein by reference.

FIELD OF THE INVENTION

The present invention pertains generally to electrical connectors. More specifically, the present invention pertains to deflection beam electrical connectors which project from a base member to establish electrical contact between electrical devices. The present invention is particularly, but not exclusively, useful for establishing a plethora of electrical circuits between electrical devices.

BACKGROUND OF THE INVENTION

Many electrical devices require connection with the electrical circuits of other electrical devices in order for them to function properly. Indeed, it is not uncommon for an electrical device to require simultaneous connection with a great many electrical circuits in other devices. To satisfy this requirement, connectors have been developed that can establish as many as seven or eight hundred different electrical circuits between electrical devices. Commonly used terms for such connectors include: "pin grid array" and "land grid array".

Typically, a grid array will include a generally flat base member, and will have a multitude of individual electrical connectors. For most applications, these connectors are mounted as an array on the base member and extend from both sides thereof to establish as many different electrical pathways through the base member of the array.

A commonly used component for the individual electrical connectors of a land grid array is a deformable, electrically conductive, wire mesh structure known as a "fuzz button". In addition to establishing an electrical pathway, an important attribute of these so-called fuzz buttons is that they are inherently resilient and flexible. This resilience and flexibility, however, can be both beneficial and detrimental to the performance of the land grid array.

On the one hand, resilience and flexibility in an electrical connector are desirable in that these qualities promote the proper engagement of an electrical connector with an electrical device. For instance, some relative movement between the connector and the device is beneficial for causing a "wiping" action which helps assure electrical contact between the device and the connector, and thereby establish the electrical pathway through the connector. Further, some flexibility between electrical components is advantageous in order to accommodate variations in the tolerances that are engineered into electrical devices. Although fuzz buttons are generally highly deformable, and easily accommodate tolerance variations, they can become misshaped with extended, repetitive use. Thus, they can give uneven contact pressures between the various electrical contact points. For the same reason, fuzz buttons are prone to loosing their registration with the contact points on the electrical connector to which they are mated. With either uneven contact pressures or lost registration, essential electrical circuits may not be established by the land grid array. To overcome these shortcomings, other electrical contact structures need to be considered.

Electrical contact fingers which are mounted on base members, and which are cantilevered therefrom, have certain structural attributes which are beneficial to an electrical connector. First, a cantilevered contact finger can be engineered to have a requisite flexibility. Second, the finger can be engineered to maintain structural integrity and dependability over a prolonged duty life. Further, when used within engineered limitations, solid fingers are minimally susceptible to becoming deformed or misshaped. Thus, they are able to effectively maintain their strength and their ability to be repetitively repositioned in register.

In addition to flexible connectors, it is also often desirable to have more solid and permanently established electrical contact points incorporated into a connector assembly. Soldering is a well known technique for establishing such contact points. However, in order to establish solder points where numerous such points must be simultaneously established, it is necessary to accurately register the solder points and to have them properly connected between other circuitry.

An important concern for electrical connectors involves the mechanical forces which are generated against the electrical components when they are electrically joined to each other via the connector. For the particular instance of a land grid array scheme where opposed flexible contact points is to be used to connect one electrical device with another, the forces which are required to establish and maintain the connection between electrical components can be considerable. Specifically, for land grid array schemes which use one cantilevered beam to establish electrical contact with one device and an opposed cantilevered beam to establish electrical contact with another device, when both beams are between the devices the forces which are respectively generated by the two beams will be additive. Consequently, the resultant force against each of the electrical components is the sum of the separate forces that are generated by the two individually deflected beams. For many applications, this resultant force may be too large. However, if one of these beams is replaced with a solder connection, which involves no interactive forces, the force of the replaced beam will be effectively eliminated. The resultant force on the electrical components will thereby be effectively halved.

In light of the above, it is an object of the present invention to provide a land grid array which will establish reliable electrical circuits, despite repeated use over a prolonged period of time. Another object of the present invention is to provide a land grid array connector which effectively maintains registration for a plethora of electrical circuits. Still another object of the present invention is to provide a land grid array connector which is adaptable for engagement with different types of electrical devices. Another object of the present invention is to provide a land grid array connector which incorporates both flexible contact pin connectors and fixed solder points in the same electrical connector assembly. It is also an object of the present invention to provide a land grid array connector which tends to minimize the resultant forces that are generated by the connector assembly against the electrical components it is interconnecting. Yet another object of the present invention is to provide a land grid array which is simple to use, relatively easy to manufacture and comparatively cost effective.

SUMMARY OF THE PREFERRED EMBODIMENTS

A land grid array interposer in accordance with the present invention includes a substantially flat plate-like base which is made of a rigid dielectric material such as plastic. The base has a flat top (first) surface and a flat bottom (second) surface, and is formed with a plurality of apertures which extend through the base from surface to surface. These apertures are arranged in rows and columns to form a matrix.

A plurality of electrical connectors are mounted on the base. Specifically, each connector has a central portion and a pair of integral fingers which extend from the central portion. In relation to the central portion, the fingers are off-set from each other so that their respective axes are substantially parallel to each other, and each of the fingers extends from the central portion in a direction that is substantially opposite to that of the other finger. When mounted on the base, the central portion of each connector is embedded into the base. When embedded into the base, the connector is oriented so that one finger of the connector extends into one aperture of the base while the other finger of the connector extends into another aperture of the base. Thus, the fingers are effectively cantilevered from the base into juxtaposed apertures.

As intended for the present invention, in addition to being cantilevered into juxtaposed apertures, the fingers are also angled such that their respective tips project outwardly from a surface of the base. Specifically, the tip of one finger of each connector projects outwardly from the top (first) surface of the base, while the tip of the other finger projects outwardly from the bottom (second) surface of the base. With this cooperation of structure, an electrical circuit is established by each connector which extends through the land grid array from one surface to the other surface. Additionally, it is to be noted that the cantilevered fingers, with their respective tips, are deflectable. As alluded to above, finger deflectability is desirable in order to provide the resilience and flexibility necessary for an effective wiping action between the connector finger and the electrical contact of an electrical device. It also accommodates variations in engineered tolerances between electrical devices that are connected through the land grid array. Furthermore, finger deflectability also establishes a biasing force which urges the finger into electrical contact with the associated electrical device.

For the assembled land grid array of the present invention, the connector tips that project outwardly from the first surface of the base are arranged in a plane as a matrix having a plurality of rows and a plurality of columns. Similarly, the connector tips that project outwardly from the second surface of the base are arranged in a parallel plane as a matrix having a plurality of rows and a plurality of columns. Consequently, the land grid array is capable of electrically connecting a plethora of in-plane contacts from one electrical device with a plethora of in-plane contacts of another such device.

For an alternate embodiment of the present invention, one cantilevered finger of each connector is replaced with a projecting extension. Thus, in this embodiment, the connector includes a central portion with an integral finger extending therefrom in one direction and an extension projecting therefrom in an opposite direction. Again, the central portion is embedded into the base while the finger and the extension of the connector respectively protrude into juxtaposed apertures. More specifically, and somewhat like the embodiment of the present invention disclosed above, all of the connector fingers have tips which are arranged in a coplanar matrix. Also, all of the extensions have solder points which are arranged in a coplanar matrix. In relation to each other, the planar matrix of finger tips is substantially parallel to the planar matrix of solder points. This is done so that when the solder points of the land grid array are surface mount soldered to one device (e.g. a motherboard), the connector will establish a plethora of electrical circuits which can be connected to a second device (e.g. a microprocessor) when the second device is engaged with the first device.

In the manufacture of the land grid array of the present invention, a pattern of a plurality of connectors is stamped or chemically etched from a sheet of electrically conductive material, such as a metal. At the time the sheet metal is stamped or etched, the connector fingers can be appropriately angled from the respective central portions of the connectors. On the other hand, the connector fingers can be angled subsequently after molding if desired. Further, the tips of the connector fingers can be selectively plated with gold to enhance the electrical contact between the connector finger and the electrical device that is to be later engaged with the land grid array. Alternatively, the entire contact surface of the contact fingers can be gold plated to reduce the impedance of the connector.

After the pattern of connectors has been stamped or etched from the sheet, the pattern is partially or completely placed in the cavity mold of an injection molding machine, and a plastic material is molded onto the pattern. Specifically, the plastic is injection molded onto the connector pattern to form a substantially flat base for the land grid array which will have a first (upper) surface and an opposite second (lower) surface after separation and forming. As molded, the base has a plurality of apertures that extend through the base from one surface to the other, and there are two connector fingers which will extend from the base into each of the apertures after they are singulated and formed. The two connector fingers in an aperture, however, are from different juxtaposed connectors. On the other hand, the contact tips (fingers) for each connector extend from different juxtaposed apertures. Thus, one finger extends outwardly from one aperture in one direction, past the first surface, and the other finger of the connector extends outwardly from a juxtaposed aperture in the opposite direction, past or toward the second surface.

Once the base has been injection molded onto the stamped or etched sheet of electrical connectors, the various electrical connectors are electrically isolated from each other either before or after forming. This is accomplished through a process called singulation. Specifically, by the process of singulation, the tie bars which previously joined the electrical connectors together are separated. This is done by methods well known in the art, such as mechanical means (e.g. shearing) or laser means.

For the alternate embodiment of the present invention, instead of forming a finger tip which extends beyond the surface of the base, the connector is formed with an extension which includes a substantially flat portion. This flat portion, also referred to herein as a foot, is formed on the extension to lie substantially in the plane of the surface of the base. With this configuration, the foot can be positioned against a contact rod on an electrical device and soldered thereto.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENT

Figure 1:
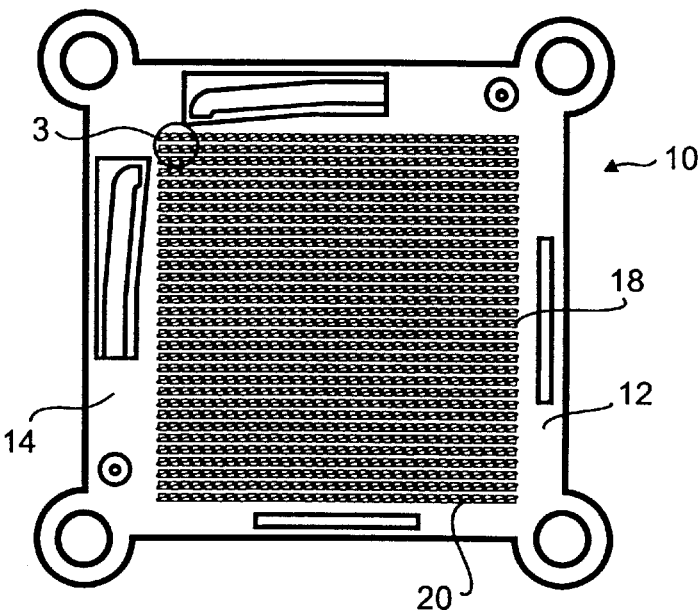
FIG. 1 is a top plan view of a land grid array according to the present invention.
Figure 2:
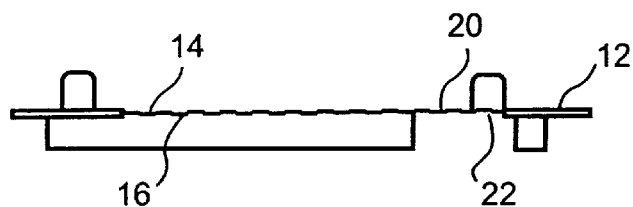
FIG. 2 is a side elevation view of the land grid array according to the present invention.

Referring initially to FIG. 1, a land grid array in accordance with the present invention is shown and generally designated 10. By cross referencing FIG. 1 and FIG. 2, it will be appreciated that the array 10 includes a base 12 which is substantially flat and which defines an upper surface 14 and a lower surface 16. As intended for the present invention, the base 12 is made of a dielectric material, such as plastic.

In overview, the land grid array 10 of the present invention includes a plurality of electrical connectors 18 which are arranged on the base 12 to establish a matrix 20 of electrical contact points that extend outwardly from the upper surface 14. Similarly, the plurality of electrical connectors 18 also establish a matrix 22 of electrical contact points which extend outwardly from the lower surface 16. All of the connectors 18 are made of an electrically conducting material, such as a metal, and are oriented on the base 12 to establish a plurality of electrical circuit connections which pass from the upper surface 14 to the lower surface 16. With this arrangement, the matrix 20 and upper surface 14 of land grid array 10 are engageable with an electronic device, while the matrix 22 and lower surface 16 of land grid array 10 are engageable with another electronic device (see FIG. 6B).

Figure 3:
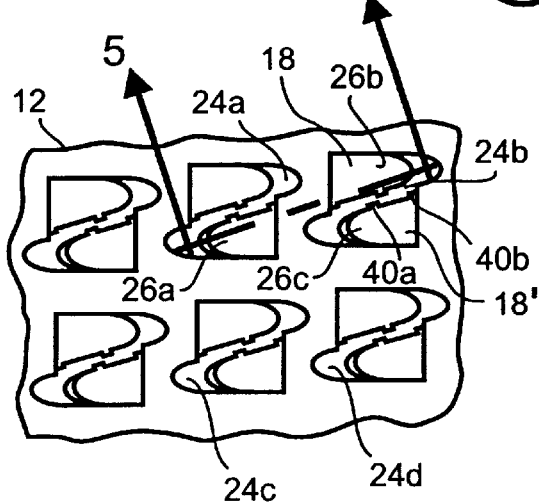
FIG. 3 is an enlarged top view of a portion of the land grid array taken from the circled portion shown in FIG. 1 and designated with the numeral 3.
Figure 4:
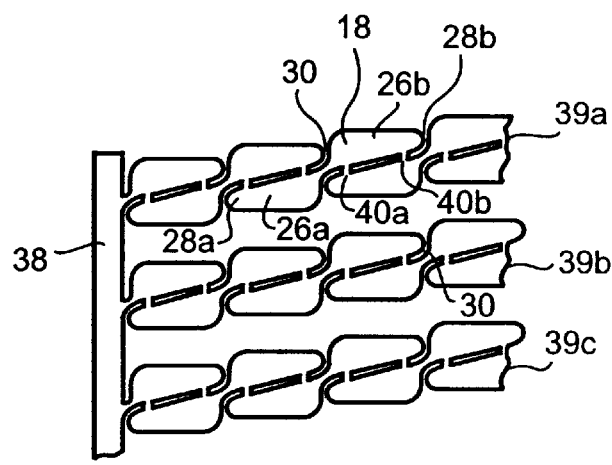
FIG. 4 is a top view of connectors after being stamped or etched from a sheet of metal.

Referring now to FIG. 3, it will be seen that the base 12 of land grid array 10 is formed with a plurality of apertures 24, of which the apertures 24a–d are representative. These apertures 24 extend through the base 12 from first surface 14 to second surface 16 and are preferably arranged in rows and columns substantially as shown. Further, as perhaps best appreciated with reference to FIG. 3, each of the connectors 18 extend from the base 12 into two adjacent juxtaposed apertures 24. Specifically, consider a connector 18 as shown in FIGS. 3 and 4. Connector 18 includes two fingers 26a and 26b which have respective tips 28a and 28b. Further, the two fingers 26a and 26b are integral with a central portion 30 and extend from the central portion 30 into the respective apertures 24a and 24b. A more detailed appreciation of the cooperation between the base 12 and each individual connector 18 in the land grid array 10 is possible with reference to FIG. 5.

Figure 5:
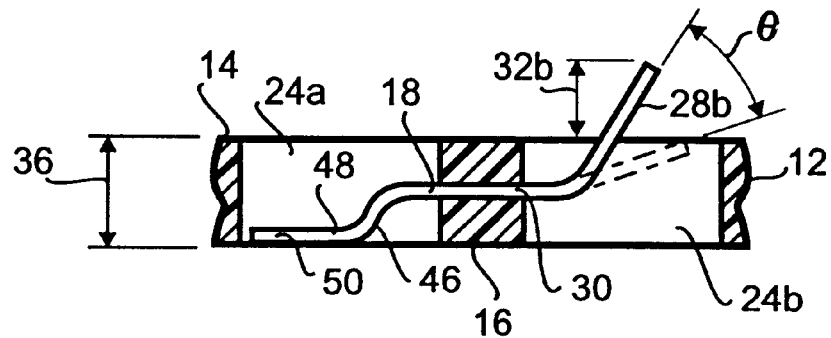
FIG. 5 is a cross sectional view of a connector embedded in the base as would be seen along the line 5—5 in FIG. 3.

In FIG. 5 it can be seen that the central portion 30 of the connector 18 is actually embedded into the base 12. Additionally, it can be seen that the finger 26a extends into aperture 24a, and that the finger 26b is cantilevered into aperture 26b. As shown in FIG. 5, the finger 26b of connector 18 is bent at an angle θ so that its tip 28b protrudes from the aperture 26b. Preferably, θ is between approximately 45° to 60° and the tip 28b protrudes outwardly from and beyond the surface 14 of base 12. Specifically the tip 28b extends beyond the upper surface 14 through a deflection distance 32b. The deflection distance 32b is preferably between approximately ten thousandths of an inch (0.010 in.) to twelve thousandths of an inch (0.012 in.). Also, as best seen in FIG. 5, the thickness 36 of base 12 from the upper surface 14 to the bottom surface 16 will be about eighteen thousandths of an inch (0.018 in.).

Figure 6A:
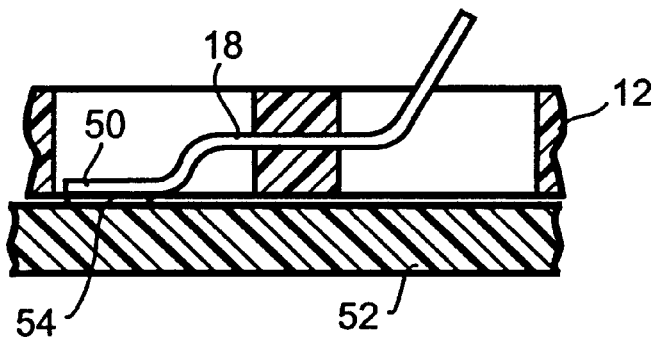
FIG. 6A is a cross sectional view of the connector in FIG. 5 after being soldered to an electrical device.

Still referring to FIG. 5 it will be seen that the connector 18 includes an extension 46. Specifically, the extension 46 of connector 18 is integral with the central portion 30 of the connector 18. Additionally, it includes a foot 48 which has a substantially flat surface that serves as a solder point 50 for the connector 18. Generally, the surface of solder point 50 will be substantially coplanar with the lower surface 16 of base 12. As so configured, it is intended that the extension 46 will not deflect, and thus will not create a force, when the solder point 50 is affixed or surface mounted in electrical contact with an electrical device. Such a connection is shown in FIG. 6A.

In the manufacture of the land grid array 10 for the present invention, the plurality of the connectors 18 are stamped or etched from a sheet 38 in a manner well known in the pertinent art. As intended for the present invention, the connectors 18 remain joined together in lines 39 at this stage of manufacture of which the lines 39a–c shown in FIG. 4 are exemplary. The resultant pattern of connectors 18 which shows all of the connectors 18 joined together is, perhaps, best appreciated with reference to FIG. 4.

As shown in FIG. 4, the stamped or etched connectors 18 are initially joined together by tie bars 40. In addition to forming the plurality of connectors 18 during this initial stamping procedure, it will be appreciated that the tips 28 of the fingers 26 can be plated to enhance their electrical contact abilities. Preferably, this plating is done with gold, and is approximately thirty microns thick. In any case, once connectors 18 have been stamped, the stamped sheet 38 is then placed in the mold of an injection molding machine (not shown). Next, the base 12 is injection molded around portions of the connectors 18.

The injection molding of base 12 onto and around portions of the stamped sheet 38 of connectors 18 is accomplished to achieve a certain orientation for the connectors 18 relative to the base 12. Specifically, the central portions 30 of all of the various connectors 18 are embedded into the base 12. This anchors the connectors 18 into the base 12. Additionally, as clearly shown by cross referencing FIGS. 3 and 4, the fingers 26 of all of the connectors 18 are cantilevered from the base 12 into juxtaposed apertures 24. For example, the fingers 26a, 26b of connector 18 are cantilevered in opposite directions into the juxtaposed apertures 24a, 26b. Thus, an electrical circuit is established through the connector 18.

As appreciated by reference to FIG. 3, an aperture 24 can accommodate two fingers 26, with each finger 26 being from a different connector 18. For example, consider the connectors 18 and 18', and the aperture 26b. The finger 26b of connector 18 and the finger 26c of connector 18' are both cantilevered into the aperture 26b. Preferably, while the finger 26b of connector 18 extends beyond the upper surface 14 of base 12, the finger 26c from the connector 18' will extend to the lower surface 16 of base 12. A similar arrangement of fingers 26 in apertures 24 thus continues in rows and columns throughout the land grid array 10.

Once the connectors 18 have been embedded into the base 12 as disclosed above, the connectors are electrically isolated from each other. This is done by a process generally referred to as "singulation". Specifically, the tie bars 40 (shown in FIGS. 3 and 4) are removed or sheared. This can be done either mechanically by shearing or by any other means known in the art, such as by lasers. Access to the tie bars 40 for purpose of disconnecting the connectors 18 from each other is provided through the apertures 24. Singulation can be accomplished either while the base 12 is still in the mold, or after the combination of base 12 and connectors 18 is removed from the mold.

For the operation of the land grid array 10, FIG. 6A shows a portion of the land grid array 10 in contact with an electrical device 52 (e.g. a motherboard). Specifically, a solder contact 54 on the device 52 is positioned against the solder point 50 of the connector 18'. In any manner well known in the pertinent art, the solder contact 54 can be altered to permanently and fixedly connect the solder point 50 with electronic circuitry (not shown) in the device 52 (e.g. the motherboard). Once the land grid array 10, with connectors 18, has been affixed to the device (motherboard) 52 as disclosed above, another electronic device 56 (e.g. a microprocessor) may be placed into electrical contact with the array 10.

Figure 6B:
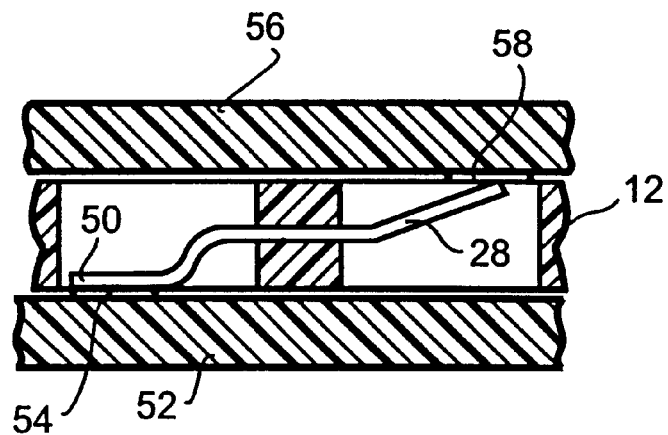
FIG. 6B is a cross sectional view of the connector in FIG. 6A after being placed in electrical contact between two electrical devices.

As suggested in FIG. 6B an electronic device (microprocessor) 56 can be engaged with the electronic device (motherboard) 52 to bring the device 52 into contact with the array 10. When this happens, the pins 28 of the array 10 are urged against the contact pads 58 on the device 56 and are deflected. As discussed above, this deflection of the pins 28 establishes electrical contact between the device 56 and the connector 18'. Since the connector 18 is already in contact with the device 52 via the solder points 50 of extension 46, and electrical connection between the devices 52 and 56 is established through the connector 18.

It is to be appreciated that the land grid array 10 can be bolted or otherwise attached to a device 52, 56 with the pins 26 deflected against the device 52,56. This will then leave the solder points 50 exposed for a surface mount. Thus, the array 10 is versatile and can be used in several different ways to interconnect devices 52,56.

While the particular High Density Multi-Pin Connector With Solder Points as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A land grid array which comprises:

a base having a first surface and a second surface with said second surface being substantially parallel to said first surface, said base formed with at least two apertures with each said aperture being open through said base from said first surface to said second surface; and a connector mounted on said base between two said apertures, said connector having a finger with a deflectable tip cantilevered from said base into one said aperture to project said tip thereof outwardly beyond said first surface of said base, and having an extension formed with a surface, said extension projecting from said base into said other aperture with said surface of said extension substantially coplanar with said second surface of said base to establish a solder point for an electrical circuit through said connector from said first surface of said base to said second surface of said base.

2. A land grid array as recited in claim 1 further comprising a plurality of said connectors wherein said tips of said fingers are arranged as a matrix with a plurality of rows and a plurality of columns to define a first plane, and said solder points of said extensions are arranged as a matrix with a plurality of rows and a plurality of columns to define a second plane.

3. A land grid array as recited in claim 1 wherein said base is formed with a plurality of apertures and a plurality of said apertures have one said finger and one said solder point therein.

4. A land grid array as recited in claim 1 wherein said tips of said fingers are gold plated to at least a thickness of thirty micro-inches (30 $\mu$in).

5. A land grid array as recited in claim 1 wherein said tips of said fingers project outwardly from said first surface between approximately ten thousandths of an inch (0.010 in.) to twelve thousandths of an inch (0.012 in.) when not deflected and are substantially in-plane with said first surface when deflected.

6. A land grid array as recited in claim 1 wherein said base is made of a rigid plastic.

7. A land grid array as recited in claim 6 wherein said connectors are made from a sheet of stamped metal, said metal sheet being approximately two thousandths of an inch thick (0.002 in), and wherein said base is injection molded onto said stamped sheet.

8. A land grid array for establishing a plurality of electrical circuits between a first electrical device and a second electrical device, said array comprising:

a base fixedly positioned between said first device and said second device, said base being formed with a plurality of apertures therethrough; and a plurality of connectors, each said connector having a central portion with a deflectable finger and an extension projecting therefrom, said central portion of each said connector being embedded in said base between juxtaposed apertures to cantilever said finger from said base into one said aperture for urging said finger into electrical contact with said first device, and to project said extension from said base into another said aperture to position said extension for electrical contact with said second device.

9. A land grid array as recited in claim 8 wherein said fingers each have a tip and said tips of said fingers are arranged as a matrix with a plurality of rows and a plurality of columns to define a first plane, and wherein said extensions each have a solder point surface and said solder point surface of said extensions are arranged as a matrix with a plurality of rows and a plurality of columns to define a second plane, said first plane being substantially parallel to said second plane with each tip in said first plane being electrically connected to a respective solder point surface in said second plane to establish a plurality of electrical circuits between said first plane and said second plane.

10. A land grid array as recited in claim 8 wherein a plurality of said apertures has a finger and an extension projected therein.

11. A land grid array as recited in claim 8 wherein said tips of said fingers are gold plated to at least a thickness of thirty micro-inches (30 $\mu$in).

12. A land grid array as recited in claim 8 wherein said base has a first surface and a second surface, and wherein said tips of said fingers project outwardly from said first surface between approximately ten thousandths of an inch (0.010 in.) to twelve thousandths of an inch (0.012 in.) when not deflected and are substantially in-plane with said first surface when deflected.

13. A land grid array as recited in claim 8 wherein said base is made of a rigid plastic.

14. A land grid array which comprises:

a base formed with a plurality of apertures;

a plurality of electrical contact tips, each said contact tip being cantilevered from said base into a separate said aperture, said plurality of contact tips being arranged as a matrix with a plurality of rows and a plurality of columns to define a first plane; and a plurality of electrical contact solder points, each said solder point being projected from said base into a separate said aperture, said plurality of solder points being arranged as a matrix with a plurality of rows and a plurality of columns to define a second plane, said first plane being substantially parallel to said second plane with each said contact tip in one said aperture in said first plane being electrically connected through said base to a respective solder point in another said aperture in said second plane to establish a plurality of electrical circuits between said first plane and said second plane.

15. A land grid array as recited in claim 14 wherein said tips in said first plane are deflectable.

16. A land grid array as recited in claim 15 wherein said base has a first surface and a second surface and wherein said tips of said first plane project outwardly from said first surface between approximately ten thousandths of an inch (0.010 in.) to twelve thousandths of an inch (0.012 in.) when not deflected and are substantially in-plane with said first surface when deflected.

17. A land grid array as recited in claim 14 wherein said tips in said first plane are gold plated to at least a thickness of thirty micro-inches (30 $\mu$in).

18. A land grid array as recited in claim 14 wherein said base is made of a rigid plastic.

19. A land grid array as recited in claim 18 wherein said electrical contact tips are made from a sheet of stamped metal, said metal sheet being approximately two thousandths of an inch thick (0.002 in), and wherein said base is injection molded onto said stamped sheet.

* * * * *

UNITED STATES PATENT AND TRADEMARK OFFICE
CERTIFICATE OF CORRECTION

PATENT NO. : 5,967,797
DATED : October 19, 1999
INVENTOR(S) : Ralph Maldonado

It is certified that error appears in the above-identified patent and that said Letters Patent is hereby corrected as shown below:

Column 5, Line 67
DELETE
[aperture 26b]
INSERT
--aperture 24b--

Column 6, Line 2
DELETE
[aperture 26b]
INSERT
--aperture 24b--

Column 6, Line 55
DELETE
[26b]
INSERT
--24b--

Column 6, Line 60
DELETE
[aperture 26b]
INSERT
--aperture 24b--

Column 6, Line 62
DELETE
[aperture 26b]
INSERT
--aperture 24b--

Signed and Sealed this

First Day of August, 2000

Attest:

Attesting Officer

Q. TODD DICKINSON
Director of Patents and Trademarks